(12) United States Patent
Jakubowski et al.

(10) Patent No.: US 8,679,940 B2
(45) Date of Patent: Mar. 25, 2014

(54) METHODS FOR FABRICATING SEMICONDUCTOR DEVICES WITH ISOLATION REGIONS HAVING UNIFORM STEPHEIGHTS

(75) Inventors: Frank Jakubowski, Dresden (DE); Jörg Radecker, Dresden (DE); Frank Ludwig, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 98 days.

(21) Appl. No.: 13/399,727

(22) Filed: Feb. 17, 2012

(65) Prior Publication Data

US 2013/0217205 A1    Aug. 22, 2013

(51) Int. Cl.
*H01L 21/302* (2006.01)

(52) U.S. Cl.
USPC .................................. 438/424; 257/E21.214

(58) Field of Classification Search
USPC .................................. 438/424; 257/E21.214
See application file for complete search history.

(56) References Cited

U.S. PATENT DOCUMENTS

| | | | | |
|---|---|---|---|---|
| 5,950,094 A | * | 9/1999 | Lin et al. | 438/409 |
| 5,989,978 A | * | 11/1999 | Peidous | 438/436 |
| 6,239,002 B1 | * | 5/2001 | Jang et al. | 438/435 |
| 7,012,010 B2 | * | 3/2006 | Doan et al. | 438/427 |
| 8,012,847 B2 | * | 9/2011 | Patraw et al. | 438/427 |
| 2004/0082181 A1 | * | 4/2004 | Doan et al. | 438/700 |
| 2006/0128111 A1 | * | 6/2006 | Beintner et al. | 438/400 |
| 2006/0223279 A1 | * | 10/2006 | Patraw et al. | 438/427 |
| 2008/0081404 A1 | * | 4/2008 | Barna et al. | 438/197 |
| 2010/0187450 A1 | * | 7/2010 | Kahlman et al. | 250/573 |
| 2012/0329239 A1 | * | 12/2012 | Kammler et al. | 438/424 |
| 2013/0095619 A1 | * | 4/2013 | Wehella-Gamage et al. | 438/164 |

* cited by examiner

*Primary Examiner* — Alexander Ghyka
*Assistant Examiner* — Stanetta Isaac
(74) *Attorney, Agent, or Firm* — Ingrssia Fisher & Lorenz, P.C.

(57) ABSTRACT

Methods for fabricating semiconductor devices are provided. In an embodiment, a method for fabricating a semiconductor device includes forming a planarization stop layer overlying a semiconductor substrate. A trench is etched through the planarization stop layer and into the semiconductor substrate and is filled with an isolation material. The isolation material is planarized to establish a top surface of the isolation material coplanar with the planarization stop layer. In the method, a dry deglaze process is performed to remove a portion of the planarization stop layer and a portion of the isolation material to lower the top surface of the isolation material to a desired stepheight above the semiconductor substrate.

20 Claims, 4 Drawing Sheets

METHODS FOR FABRICATING SEMICONDUCTOR DEVICES WITH ISOLATION REGIONS HAVING UNIFORM STEPHEIGHTS

TECHNICAL FIELD

The present disclosure generally relates to methods for fabricating semiconductor devices, and more particularly relates to methods for fabricating semiconductor devices with isolation regions having uniform stepheights.

BACKGROUND

As miniaturization of elements of an integrated circuit semiconductor device drives the industry, not only must critical dimensions of elements shrink, but also vertical variation or "topography" must be minimized in order to increase lithography and etch process windows and, ultimately, the yield of integrated circuits.

Conventional STI fabrication techniques include forming a nitride, e.g., silicon nitride, planarization stop layer on an upper surface of a semiconductor substrate, etching the stop layer and semiconductor substrate to form a trench in the semiconductor substrate, forming a thermal oxide liner in the trench and then filling the trench with isolation material, such as silicon oxide, forming an overburden on the nitride planarization stop layer. Planarization is then implemented, as by conducting chemical mechanical polishing (CMP). During subsequent processing, the nitride layer is removed followed by formation of active areas, which typically involve masking, ion implantation, and cleaning steps. During such cleaning steps, different species of oxide present in and one the various layers are removed at different rates, resulting in vertical variation in the isolation material. Further, a single species of oxide isolation material is removed at different rates depending on its location relative to other semiconductor device features. In other words, the oxide removal process and resulting isolation material stepheight are feature dependent. The vertical variation resulting from these factors inhibits the proper structure and encapsulation of any gate extending across an STI region, particularly as critical dimensions shrink.

Accordingly, it is desirable to provide methods for fabricating semiconductor devices with isolation regions having uniform stepheights. In addition, it is desirable to provide methods for fabricating semiconductor devices which utilize processes that are not feature dependent. Furthermore, other desirable features and characteristics will become apparent from the subsequent detailed description and the appended claims, taken in conjunction with the accompanying drawings and the foregoing technical field and background.

BRIEF SUMMARY

Methods are provided for fabricating a semiconductor device. In accordance with one embodiment, the method includes forming a planarization stop layer overlying a semiconductor substrate. A trench is etched through the planarization stop layer and into the semiconductor substrate and is filled with an isolation material. The isolation material is planarized to establish a top surface of the isolation material coplanar with the planarization stop layer. In the method, a dry deglaze process is performed to remove a portion of the planarization stop layer and a portion of the isolation material to lower the top surface of the isolation material to a desired stepheight above the semiconductor substrate.

In another embodiment, a method is provided for forming an isolation region having a desired stepheight above a semiconductor substrate. In the method, a planarization stop layer is formed overlying the semiconductor substrate. A trench is etched into the semiconductor substrate and is filled with an isolation material. The isolation material is planarized to the planarization stop layer. The method provides for simultaneously removing a portion of the planarization stop layer and a portion of the isolation material to establish a top surface of the isolation material at the desired stepheight above the semiconductor substrate.

In accordance with another embodiment, a method for fabricating a semiconductor device includes providing a semiconductor substrate and depositing a planarization stop layer on the semiconductor substrate. The planarization stop layer and the semiconductor substrate are etched to form trenches in the semiconductor substrate. An oxide liner is formed on the semiconductor substrate bordering the trenches. Then an oxide isolation material is deposited in the trenches. The method planarizes the oxide isolation material to the planarization stop layer. Then a dry deglaze process is performed to establish a top surface of the oxide isolation material parallel with the semiconductor substrate and to remove a portion of the planarization stop layer. Thereafter, the planarization stop layer is removed from the semiconductor substrate.

BRIEF DESCRIPTION OF THE DRAWINGS

Embodiments of the methods for fabricating a semiconductor device will hereinafter be described in conjunction with the following drawing figures, wherein like numerals denote like elements, and wherein.

DETAILED DESCRIPTION

The following detailed description is merely exemplary in nature and is not intended to limit the methods for fabricating semiconductor devices, or the fabricated semiconductor devices as claimed. Furthermore, there is no intention to be bound by any expressed or implied theory presented in the preceding technical field, background or brief summary, or in the following detailed description.

It is contemplated herein that vertical variation of the isolation material forming isolation regions in semiconductor devices can be reduced or eliminated through planarization of the isolation material followed by removal of a uniform amount of the isolation material, such as by a dry deglaze process, regardless of the location of the isolation material relative to other semiconductor features. Prior art processes typically experience difficulty in establishing uniform stepheights for isolation regions that are located varying distances between features. More specifically, current processes often lower isolation material in dense locations between semiconductor features more quickly than isolation material that is not tightly bounded. As a result, isolation regions in dense locations have smaller stepheights than isolation regions that are in less dense locations, i.e., the top surfaces of the isolation regions in dense locations are lower than the top surfaces of isolation regions in less dense locations. This non-uniformity is avoided herein.

Further, the use of the dry deglaze process (and avoidance of wet etch processing) allows for the use of additional isolation materials (i.e., STI fills such as HARP (High Aspect Ratio Process), eHARP, SOG, and other materials) that exhibit high wet etch rates requiring high temperature anneals for wet etch rate reduction. In the methods described herein, such isolation materials may be used without high temperature annealing.

Also, the methods herein minimize micro-scratch (μ-scratch) decorations and, therefore, the risk of gate stringers due to μ-scratch decorations. The dry deglaze process also provides for improved isolation material stepheight control by implementing a feed forward/feed backward loop for advanced process control.

In accordance with the various embodiments herein, a method for fabricating a semiconductor device results in reduced vertical variation in the isolation material forming the semiconductor device's isolation regions. FIGS. 1-8 illustrate, in cross section, a semiconductor device and method steps for fabricating such a semiconductor device in accordance with various embodiments herein. Various steps in the fabrication of semiconductor devices are well known and so, in the interest of brevity, many conventional steps will only be mentioned briefly herein or will be omitted entirely without providing the well known process details.

Figure 1:
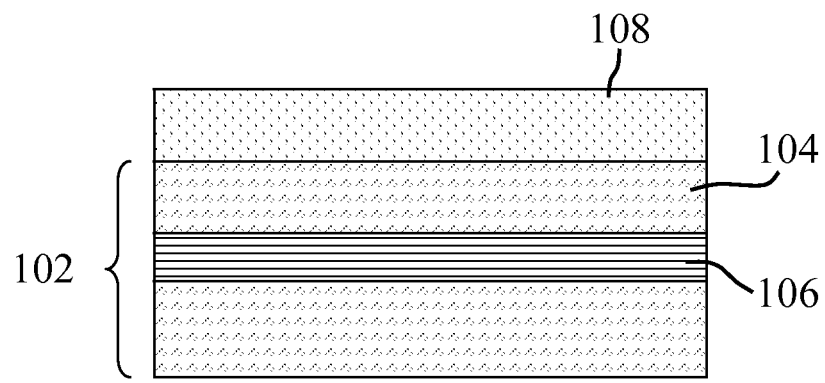
FIGS. 1-8 illustrate, in cross section, method steps for fabricating a semiconductor device in accordance with various embodiments herein.

Turning now to FIG. 1, in an exemplary embodiment, the process of fabricating a semiconductor device begins by providing a semiconductor substrate 102. The semiconductor substrate 102 may be a silicon on insulator (SOI) wafer as shown, or a bulk silicon wafer. Alternatively, the semiconductor substrate 102 can utilize germanium, gallium arsenide, and the like. The exemplary silicon on insulator (SOI) wafer semiconductor substrate 102 includes a silicon-containing material layer 104 overlying a silicon oxide layer 106. While the semiconductor substrate 102 preferably includes silicon material, the term "silicon material" is used herein to encompass the relatively pure silicon materials typically used in the semiconductor industry as well as silicon admixed with other elements.

As shown in FIG. 1, a planarization stop layer 108 is deposited on the semiconductor substrate 102. In an exemplary embodiment, the planarization stop layer 108 is a nitride layer which is deposited by chemical vapor deposition (CVD), though the planarization stop layer 108 may be formed from any etchable material that can serve as a planarization stop. Typically, there is also a thin oxide layer (pad) below the planarization stop layer 108 that is not shown herein for purposes of simplicity and clarity.

Figure 2:
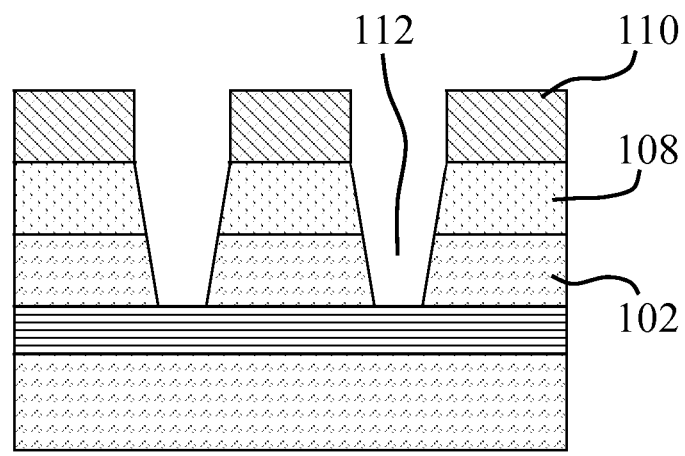
Figure 3:
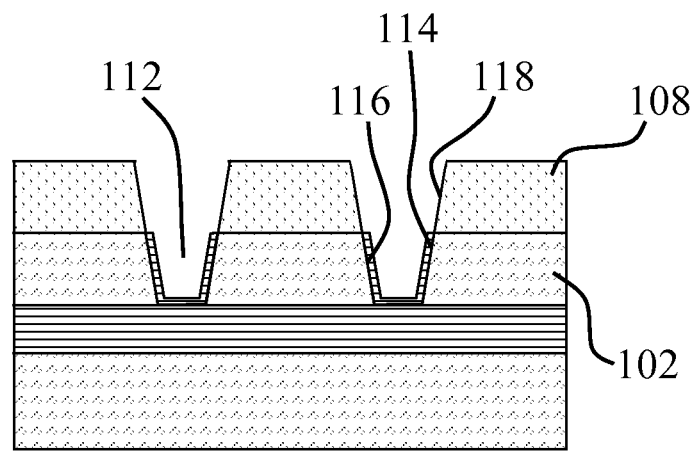

In FIG. 2, a masking material, such as resist, has been patterned over the planarization stop layer 108 to form etch masks 110 in accordance with well known active area lithography processes. Then, the planarization stop layer 108 and semiconductor substrate 102 are etched to form trenches 112 in the semiconductor substrate 102. As shown in FIG. 3, after removal of the masks 110, such as through a resist strip process, an optional liner 114 may be formed along the surfaces 116 of the semiconductor substrate 102 bordering the trenches 112. For example, the liner 114 may be formed by an oxidation process that results in forming a silicon oxide liner 114 along the surface 116 of the trenches 112 and a silicon oxynitride liner (not shown) along the surface 118 of the planarization stop layer 108. Alternatively, a CVD process can be used to form an oxide liner 114 overlying the trenches 112 and the planarization stop layer 108.

Figure 4:
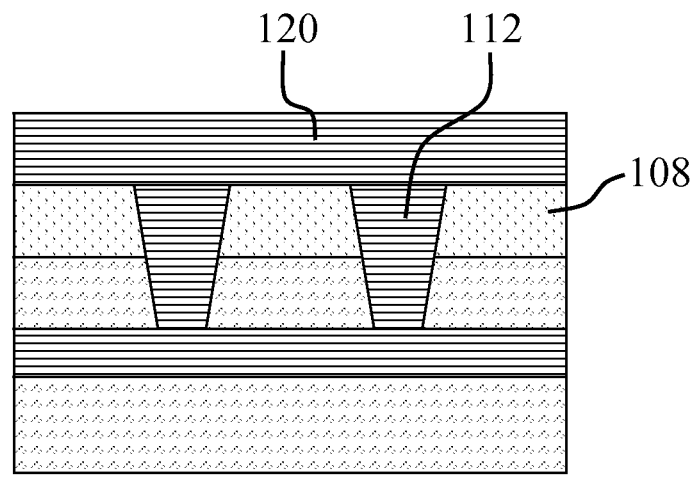
Figure 5:
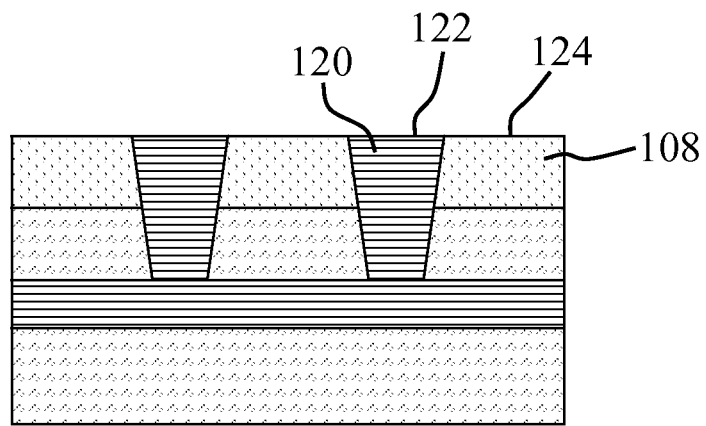

FIG. 4 illustrates the deposition of an isolation material 120 in the trenches 112 and overlying the planarization stop layer 108. An exemplary isolation material 120 is an oxide, such as silicon dioxide or other field oxide, applied by a spin-coating process. In FIG. 5, the isolation material 120 is planarized to the planarization stop layer 108, i.e., the isolation material 120 is polished until the surface 122 of the isolation material 120 is substantially coplanar with the surface 124 of the planarization stop layer 108. An exemplary process is chemical-mechanical planarization (CMP) using an abrasive and corrosive chemical slurry.

Figure 6:
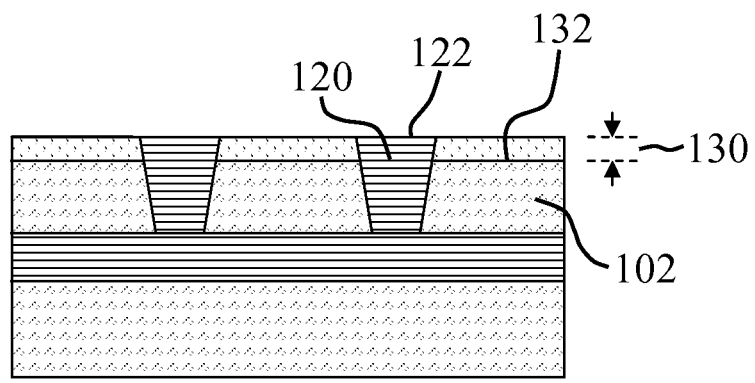

After the isolation material 120 is planarized, a dry deglaze preclean may be performed with HF, removing about 50A from the upper surface 122 of the isolation material 120 to remove any slurry particles from the CMP process. Then, a deglaze process is used to simultaneously remove a portion of the planarization stop layer 108 and a desired height/portion of the isolation material 120 to reestablish the surface 122 of the isolation material 120 at a desired step height 130 above the surface 132 of the semiconductor substrate 102 as shown in FIG. 6. In exemplary embodiments, a dry deglaze process is a reactive ion etch performed in a chamber having a pressure of 2-200 mT, such as a pressure of about 5 mT. In a particular exemplary deglaze process, about 25 sccm of CF4 and about 75 sccm of Ar are used. About 300 to about 800 Watts of power, such as about 400 Watts, is supplied to the chamber with a bias voltage of about 100 V to about 400 V, such as about 200 V. The exemplary process is performed at a temperature of about 30 to 60° C., such as about 45° C. Typical alternative gases which also may be used include, for example, CF4, CHF3, CH2F2, C4F6, C5F8, C4F8, Ar, He, O2, and N2. Different mixtures of the selected gases can be used to tune the selectivity of the deglaze process.

The exemplary process removes the oxide isolation material 120 and the oxide liner at substantially the same rate, despite the fact that the oxide isolation material and the oxide liner may be formed by different oxides. i.e., the deglaze process is non-selective regarding different species of oxides. This ability is different from current wet etch processes which etch oxide isolation material, oxide liners, and residual oxides of different species at different rates, resulting in vertical variation in the oxides. Further, an exemplary deglaze process anisotropically removes portions of the liner, the isolation material, and the planarization stop layer. Notably, as a dry anisotropic operation, the deglaze process does not widen μ-scratches caused by planarization at appreciable rates, unlike wet etch processes which suffer from μ-scratch decorations. In the exemplary process, the reduced size of the μ-scratches reduce the volume of material that can lead to stringers, further the clearing for the gate etch is more efficient.

While FIG. 6 illustrates the removal of equal portions of the planarization stop layer 108 and the isolation material 120, the height/depth of the portion of planarization stop layer 108 removed may be more or less than the height/depth of the portion of the isolation material 120 removed. In fact, the chemistry of the deglaze process can be tuned to be unselective, more selective or less selective toward removing the planarization stop layer 108 relative to the isolation material 120. During the deglaze process, the isolation material 120 is removed at a uniform depth and the surface 122 remains planar. Further, the surface 122 is substantially parallel to the semiconductor substrate 102, and the isolation material 120 has no vertical variation.

The dry deglaze process provides for improved isolation material stepheight control by implementing a feed forward/feed backward loop for advanced process control. The feedback loop uses a measurement of remaining field oxide after the dry deglaze etch or a measurement of the difference between the field oxide height and the active step height after planarization stop layer removal. The dry deglaze etch time can be fine tuned based on these measurements to improve the chamber to chamber matching. The feed forward loop uses the CMP post measurement (field oxide, planarization stop layer thickness) to adjust dry deglaze etch time for a lot or wafer, to reduce the lot to lot or wafer to wafer variation.

Figure 7:
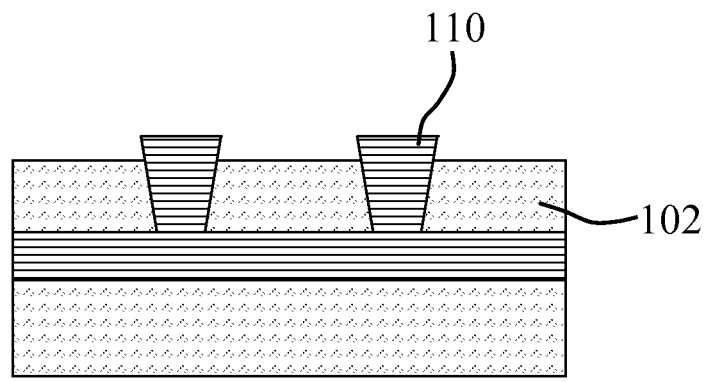

After the dry deglaze process, a dry deglaze post-clean is performed with HF to remove about 10A from the upper surface 122 of the isolation material 120 and residuals from the deglaze process. As shown in FIG. 7, the planarization stop layer 108 is removed from the semiconductor substrate 102, leaving the isolation material 110 with the desired stepheight above the semiconductor substrate 102. In an exemplary process, the planarization stop layer 108 is nitride and is removed using a hot phosphoric acid wash. In an exemplary embodiment, ion implantation is performed to form implants in the semiconductor substrate 102. Typical ion implantation involves the use of a series of implant masks and implant processes to create the desired body or well implants from the implantation of N-type ions, such as phosphorous or arsenic ions, and P-type ions, such as boron ions, to achieve a desired dopant profile for the body regions (or well regions) of subsequently formed transistor structures.

Figure 8:
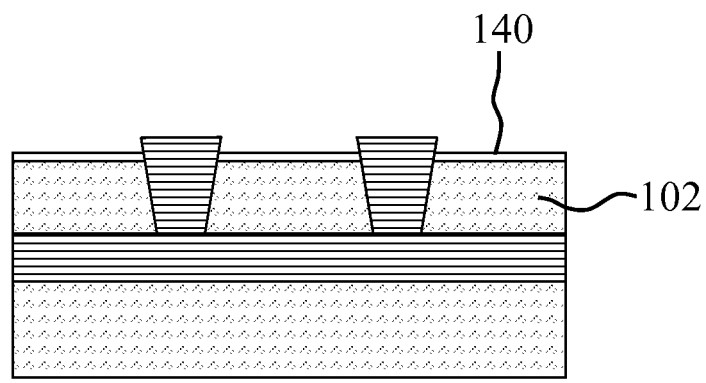

As shown in FIG. 8, a gate oxide layer 140 can then be formed on the semiconductor substrate 102 such as by CVD or thermal oxidation. Additional processing forming gate structures and transistor structures and well known final process steps (e.g., back end of line (BEOL) process steps) may then be performed. It should be understood that various steps and structures may be utilized in further processing, and the subject matter described herein is not limited to any particular number, combination, or arrangement of steps or structures.

To briefly summarize, the fabrication methods described herein result in semiconductor devices having isolation regions with planar surfaces and uniform step height. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a semiconductor device comprising:
    forming a planarization stop layer overlying a semiconductor substrate;
    etching a trench through the planarization stop layer and into the semiconductor substrate;
    filling the trench with an isolation material;
    planarizing the isolation material to establish a top surface of the isolation material coplanar with the planarization stop layer; and
    performing a dry deglaze process selective to the isolation material to remove a first portion of the planarization stop layer and a second portion of the isolation material to lower the top surface of the isolation material to a desired stepheight above the semiconductor substrate, wherein a height of the first portion is not equal to a height of the second portion.

2. The method of claim 1 further comprising forming a liner on the semiconductor substrate bordering the trench before filling the trench with the isolation material.

3. The method of claim 2 wherein performing the dry deglaze process comprises removing a third portion of the liner and the second portion of the isolation material at substantially the same rate.

4. The method of claim 2 wherein performing the dry deglaze process comprises removing a third portion of the liner, the second portion of the isolation material, and the first portion of the planarization stop layer anisotropically.

5. The method of claim 2 wherein performing the dry deglaze process comprises performing a reactive ion etch of a third portion of the liner, the second portion of the isolation material, and the first portion of the planarization stop layer.

6. The method of claim 1 further comprising forming an oxide liner on the semiconductor substrate bordering the trench before filling the trench with the isolation material, and wherein filing the trench comprises filling the trench with an oxide isolation material.

7. The method of claim 6 wherein performing the dry deglaze process comprises removing a third portion of the oxide liner and the second portion of the oxide isolation material at substantially the same rate.

8. The method of claim 6 wherein performing the dry deglaze process comprises removing a third portion of the oxide liner, the second portion of the oxide isolation material, and the first portion of the planarization stop layer anisotropically.

9. The method of claim 6 wherein performing the dry deglaze process comprises performing a reactive ion etch of a third portion of the oxide liner, the second portion of the oxide isolation material, and the first portion of the planarization stop layer.

10. The method of claim 1 wherein planarizing the isolation material comprises performing chemical-mechanical planarization on the isolation material.

11. The method of claim 1 wherein forming the planarization stop layer comprises forming a nitride planarization stop layer overlying the semiconductor substrate, and wherein the method further comprises etching the nitride planarization stop layer with hot phosphoric acid.

12. The method of claim 1 further comprising:
    selectively implanting dopant ions to form implants in the semiconductor substrate; and
    forming a gate oxide layer on the semiconductor substrate.

13. A method for forming an isolation region having a desired stepheight above a semiconductor substrate comprising:
    forming a planarization stop layer overlying the semiconductor substrate;
    etching a trench into the semiconductor substrate;
    filling the trench with an isolation material;
    planarizing the isolation material to the planarization stop layer;
    simultaneously dry etching a portion of the planarization stop layer and a portion of the isolation material to establish a top surface of the isolation material at a lowered stepheight above the semiconductor substrate and a top surface of the planarization stop layer, wherein the top surface of the planarization stop layer is not co-planar with the top surface of the isolation material; and
    implementing a feed forward/feed backward loop using a measurement of remaining oxide isolation material after the dry etching step to determine whether to repeat the dry etching step to establish the top surface of the isolation material at the desired stepheight above the semiconductor substrate.

14. The method of claim 13 further comprising forming a liner on the semiconductor substrate bordering the trench before filling the trench with the isolation material.

15. The method of claim 14 wherein simultaneously dry etching comprises simultaneously removing a portion of the liner and the portion of the isolation material at substantially the same rate.

16. The method of claim 14 wherein simultaneously dry etching comprises removing a portion of the liner, the portion of the isolation material, and the portion of the planarization stop layer anisotropically.

17. The method of claim 14 wherein simultaneously dry etching comprises performing a reactive ion etch of a portion of the liner, the portion of the isolation material, and the portion of the planarization stop layer.

18. The method of claim 13 further comprising forming an oxide liner on the semiconductor substrate bordering the trench before filling the trench with the isolation material, and wherein filing the trench comprises filling the trench with an oxide isolation material.

19. The method of claim 18 wherein simultaneously dry etching comprises simultaneously removing a portion of the oxide liner and the portion of the oxide isolation material at substantially the same rate and simultaneously removing the portion of the oxide liner, the portion of the oxide isolation material, and the portion of the planarization stop layer anisotropically by a dry deglaze process.

20. A method for fabricating a semiconductor device, the method comprising:
    providing a semiconductor substrate;
    depositing a planarization stop layer on the semiconductor substrate;
    etching the planarization stop layer and the semiconductor substrate to form trenches in the semiconductor substrate;
    forming an oxide liner on the semiconductor substrate bordering the trenches;
    depositing an oxide isolation material in the trenches;
    planarizing the oxide isolation material to the planarization stop layer;
    performing a dry deglaze process to establish a top surface of the oxide isolation material parallel with the semiconductor substrate and to remove a portion of the planarization stop layer; and
    removing the planarization stop layer from the semiconductor substrate, wherein the dry deglaze process implements a feed forward/feed backward loop using a measurement of remaining oxide isolation material after the dry deglaze process or a measurement of a difference between a height of the oxide isolation material and a height of the semiconductor substrate after removing the planarization stop layer.

* * * * *